(12) United States Patent
Sambonsugi et al.

(10) Patent No.: US 6,690,071 B2
(45) Date of Patent: Feb. 10, 2004

(54) SEMICONDUCTOR DEVICE USING JUNCTION LEAK CURRENT

(75) Inventors: Yasuhiro Sambonsugi, Kawasaki (JP); Hiroyuki Ohta, Kawasaki (JP); Shinji Sugatani, Kawasaki (JP); Yoichi Morriyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/292,465

(22) Filed: Nov. 13, 2002

(65) Prior Publication Data

US 2003/0102516 A1 Jun. 5, 2003

(30) Foreign Application Priority Data

Nov. 30, 2001 (JP) ........................................ 2001-367068

(51) Int. Cl.[7] .............................................. H01L 29/76
(52) U.S. Cl. ........................ 257/376; 257/349; 257/382; 257/412; 257/754
(58) Field of Search ................................. 257/349, 376, 257/382, 400, 412, 413, 754, 755, 768, 769, 770; 438/407, 420, 491, 514, 519, 542, 528

(56) References Cited

U.S. PATENT DOCUMENTS 6,455,903 B1 * 9/2002 Yu .............................. 257/391

6,537,886 B2 * 3/2003 Lee .............................. 438/306

FOREIGN PATENT DOCUMENTS

JP 53-68991 6/1978

OTHER PUBLICATIONS

K. Noda et al.; "A 1.9–82 m[2] Loadless CMOS Four–Transistor SRAM Cell in a 0.18–μm Logic Technology"; 1998 IEEE.

* cited by examiner

Primary Examiner—Tom Thomas
Assistant Examiner—Thomas Magee
(74) Attorney, Agent, or Firm—Westerman, Hattori, Daniels & Adrian, LLP (57) ABSTRACT

A first well of a first conductivity type is formed in a partial region of the surface layer of a semiconductor substrate. A MOS transistor is formed in the first well. The MOS transistor has a gate insulating film, a gate electrode, and first and second impurity diffusion regions of a second conductivity type on both sides of the gate electrode. A high leak current structure is formed which makes a leak current density when a reverse bias voltage is applied across the first impurity diffusion region and first well become higher than a leak current density when the same reverse bias voltage is applied across the second impurity diffusion region and first well.

14 Claims, 11 Drawing Sheets

SEMICONDUCTOR DEVICE USING JUNCTION LEAK CURRENT

CROSS REFERENCE TO RELATED APPLICATION

This application is based on Japanese Patent Application No. 2001-367068, filed on Nov. 30, 2001, the entire contents of which are incorporated herein by reference.

BACKGROUND OF THE INVENTION

A) Field of the Invention

The present invention relates to a semiconductor device and its manufacture method, and more particularly to a semiconductor device whose equivalent circuit has a load resistor connected to an impurity diffusion region formed in the surface layer of a semiconductor substrate, and its manufacture method.

B) Description of the Related Art

Polysilicon of high resistance has been used as a load resistor element of a static random access memory (SRAM) whose cell is constituted of four metal/oxide/semiconductor type field effect transistors (MOSFETs) and two load resistor elements. Load resistor elements of polysilicon increase a cell area. A load resistor cell of polysilicon is required to be connected to an upper level wiring layer, the manufacture processes become complicated.

Japanese Patent Laid-open Publication No. 53-68991 discloses a semiconductor device in which leak current flowing through a pn junction between a source or drain region and a well of a MOSFET constituting a memory cell is used as current flowing through a load resistor element. This method requires no load resistor element so that a cell area can be reduced.

Data retention technique by utilizing off-leak current of a PMOSFET used as a transfer transistor of an SRAM is disclosed in "A 1.9-$\mu m^2$ Loadless CMOS Four-Transistor SRAM Cell in a 0.18-$\mu m$ Logic Technology", Noda et al (Paper made public on IEDM, 1998).

The invention disclosed in JP-A-53-68991 does not require a dedicated area for forming a load resistor element. However, in order to obtain leak current having a desired quantity, it is necessary to increase the area of a pn junction and apply a necessary back bias to the well. Micro fine patterns and low voltage of recent semiconductor integrated circuit devices flow only a small leak current through a pn junction. It is therefore difficult to retain leak current having a desired quantity.

With the method of utilizing off-leak current of a transfer transistor of an SRAM, as gate leak current increases because of a thinned gate insulating film, it becomes necessary to increase off-current of a transfer transistor. As the off-leak current of the transfer transistor increases, there is a large danger that when data is written, this data is written also in a cell not selected. This destroys the data.

SUMMARY OF THE INVENTION

An object of this invention is to provide a semiconductor device having a small cell area and a high stability of operation.

Another object of the invention is to provide a method of manufacturing such a semiconductor device.

According to one aspect of the present invention, there is provided a semiconductor device comprising: a first well of a first conductivity type formed in a partial region of a surface layer of a semiconductor substrate; a MOS transistor having a gate insulating film formed on a partial area of a surface of the first well, a gate electrode disposed on the gate insulating film and first and second impurity diffusion regions of a second conductivity type opposite to the first conductivity type formed in a surface layer of the first well on both sides of the gate electrode; and a high leak current structure which makes a leak current density when a reverse bias voltage is applied across the first impurity diffusion region of the MOS transistor and the first well become higher than a leak current density when the same reverse bias voltage is applied across the second impurity diffusion region and the first well.

The high leak current structure can supply current to the first impurity diffusion region. Since it is unnecessary to prepare an area for disposing a resistor element for current supply, high integration of a semiconductor device is possible.

According to another aspect of the present invention, there is provided a semiconductor device comprising: an element separation insulating film formed in a partial region of a surface layer of a semiconductor substrate and defining an outer periphery of each of first and second active regions; an impurity diffusion region formed in a surface layer of the first active region; a first connection member consisting of conductive material and extending from a position above the second active region to a position above the element separation insulating film adjacent to the first active region; an interlayer insulating film covering the impurity diffusion region and the first connection member; a via hole formed through the interlayer insulating film, the via hole overlapping a partial area of the impurity diffusion region and a partial area of the first connection member as viewed along a direction in parallel to a normal to a surface of the semiconductor substrate; a second connection member buried in a space in the via hole adjacent to the semiconductor substrate, the second connection member electrically connecting the impurity diffusion region and the first connection member; a third connection member buried in a space in the via hole on the opposite side to the semiconductor substrate, the third connection member having a resistivity higher than a resistivity of the second connection member; and a wiring formed on the interlayer insulating film and connected to the third connection member.

Current is supplied to the impurity diffusion region from the wiring line via the third and second connection members. Since the third connection member functions as the resistor element, it is unnecessary to prepare a dedicated area for the resistor element. High integration of a semiconductor device is therefore possible. The first connection member is connected to the impurity diffusion region via the second connection member. Since the second connection member has a low resistance, the resistance between the first connection member and impurity diffusion region can be maintained low.

According to another aspect of the present invention, there is provided a semiconductor device comprising: an element separation insulating film formed in a partial region of a surface layer of a semiconductor substrate and defining an outer periphery of each of first and second active regions; an impurity diffusion region formed in a surface layer of the first active region; a first connection member consisting of conductive material, the first connection member extending from a position above the second active region to a position above the first active region via a region on the element separation insulating film; a conductive film electrically interconnecting the first connection member and the impurity diffusion region, the conductive film extending from an upper surface of the first connection member to an upper surface of the impurity diffusion region via a side wall of the first connection member; an interlayer insulating film covering the impurity diffusion region and the first connection member; a via hole formed through the interlayer insulating film, the via hole overlapping a partial area of the conductive film as viewed along a direction in parallel to a normal to a surface of the semiconductor substrate; a second connection member buried in the via hole and consisting of material having a resistivity higher than a resistivity of the conductive film; and a wiring formed on the interlayer insulating film and connected to the second connection member.

Current is supplied to the impurity diffusion region from the second connection member. Since the second connection member functions as the resistor element, it is unnecessary to prepare a dedicated area for the resistor element. High integration of a semiconductor device is therefore possible. The first connection member is connected to the impurity diffusion region via the conductive film. Therefore, even if the second connection member has a high resistance, the resistance between the first connection member and impurity diffusion region can be maintained low.

As above, current can be supplied to the impurity diffusion region formed in the surface layer of a semiconductor substrate from the power supply wiring line via the resistance member without reserving a dedicated area for a resistor element. By applying this structure to an SRAM, current necessary for data retention can be obtained without increasing the cell area.

DESCRIPTION OF THE PREFERRED EMBODIMENTS

Figure 1:
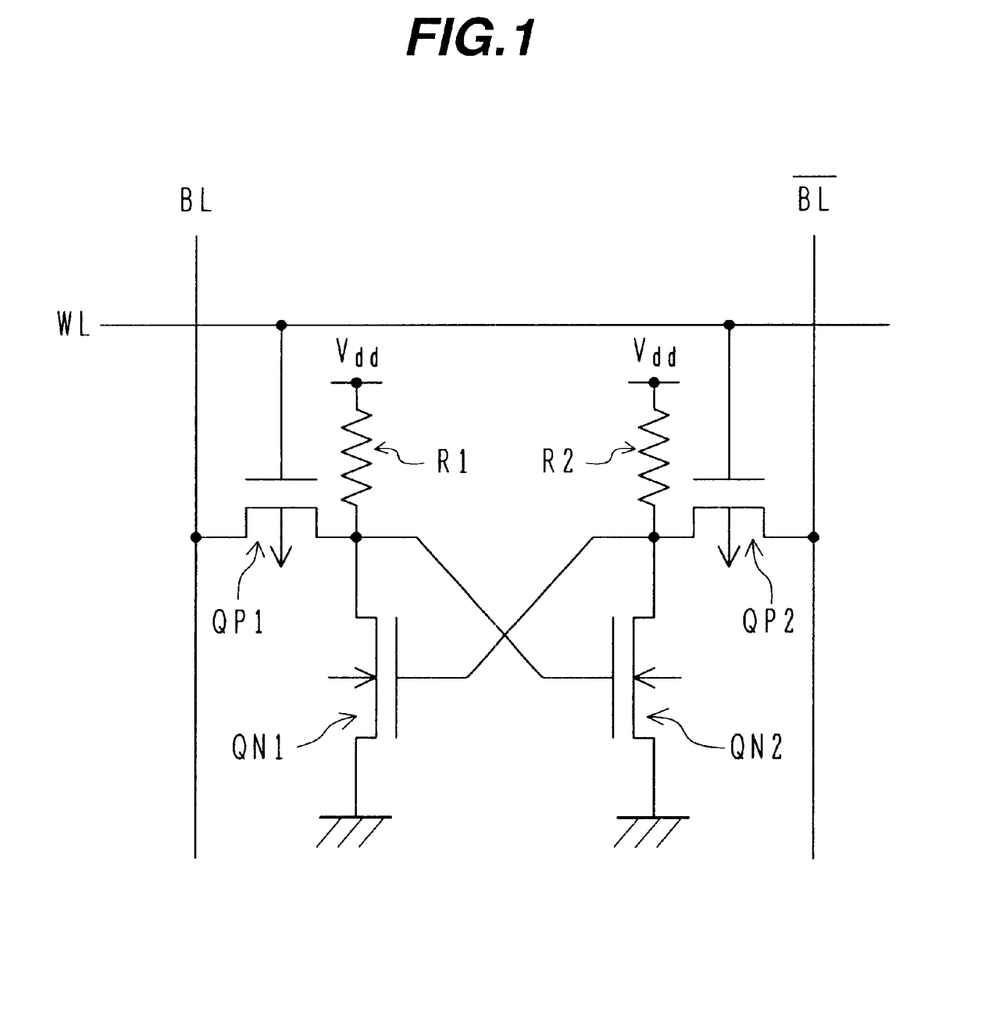
FIG. 1 is an equivalent circuit diagram of an SRAM cell.

FIG. 1 is an equivalent circuit diagram of an SRAM cell according to a first embodiment of the invention. A resistor element R1 and an NMOS transistor QN1 are serially connected to constitute an inverter. A resistor element R2 and an NMOS transistor QN2 are serially connected to constitute an inverter.

An interconnection point (a drain terminal of the NMOS transistor QN1) between the resistor element R1 and NMOS transistor QN1 is connected to a gate electrode of the NMOS transistor QN2, and an interconnection point (a drain terminal of the NMOS transistor QN2) between the resistor element R2 and NMOS transistor QN2 is connected to a gate electrode of the NMOS transistor QN1. A power supply voltage Vdd is applied to the other ends of the resistor elements R1 and R2, and source terminals of the NMOS transistors QN1 and QN2 are grounded.

The interconnection point between the resistor element R1 and NMOS transistor QN1 is connected via a PMOS transistor QP1 to a bit line BL, and the interconnection point between the resistor element R2 and NMOS transistor QN2 is connected via a PMOS transistor QP2 to an inverted bit line /BL. "/BL" means BL with an over-bar. Gate electrodes of the PMOS transistors QP1 and QP2 are connected to a word line WL.

Figure 2:
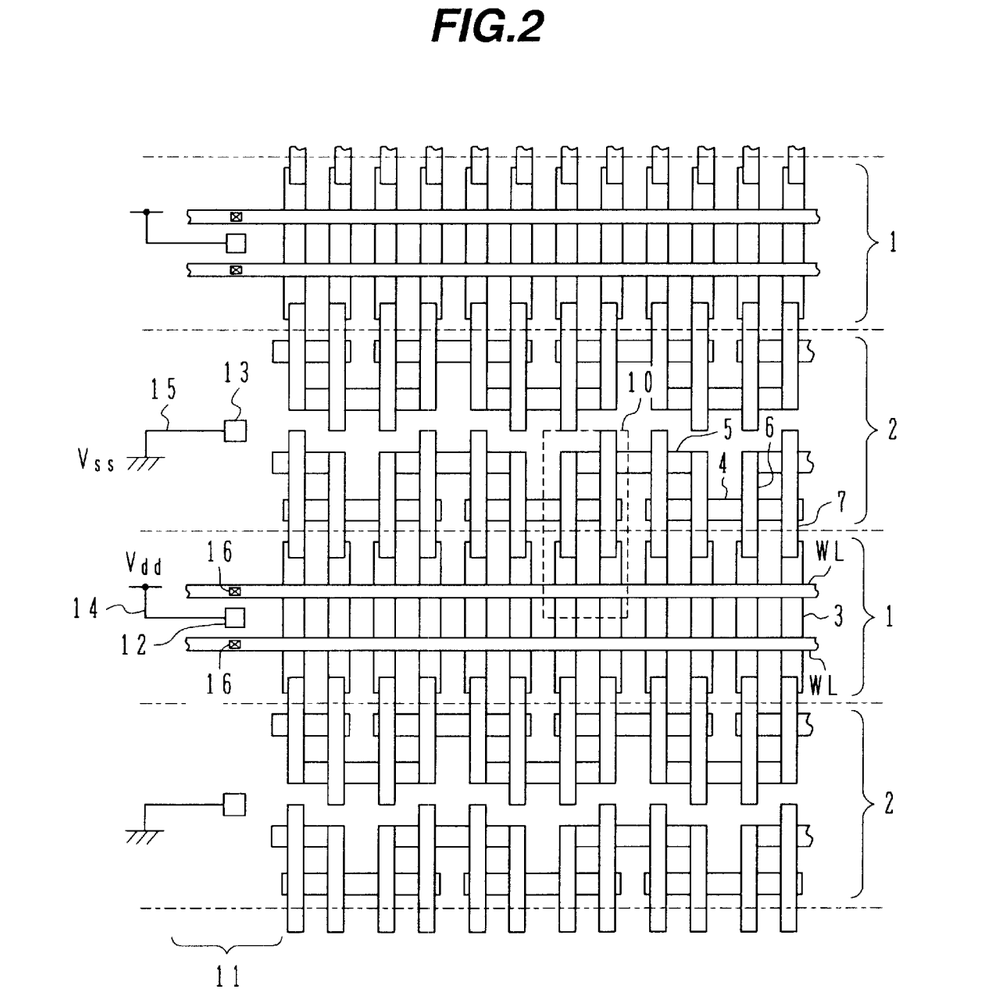
FIG. 2 is a plan view showing active regions and gate electrode layers of a semiconductor device according to a first embodiment.

FIG. 2 is a plan view showing the structure of an SRAM of the first embodiment from a semiconductor substrate surface to the layer where gate electrodes are disposed. In a surface layer of a silicon semiconductor substrate, n-type wells 1 and p-type wells 2 are disposed extending along a row direction (lateral direction) in FIG. 2. The n- and p-type wells 1 and 2 are alternately disposed along a column direction (vertical direction) in FIG. 2.

Active regions 3 are disposed in the n-type well 1 regularly along the row direction. The active region 3 has a shape elongated along the column direction. Active regions 4 are disposed in the p-type well 2 regularly along the row direction. The active region 4 has a shape elongated along the row direction, the length of the active region 4 corresponding to four active regions 3 disposed along the row direction. Active regions 5 are also disposed in the p-type well 2 regularly along the row direction. The row along which the active regions 4 are disposed is positioned between the row along which the active regions 5 are disposed and the n-type well 1. Each active region 5 has a shape elongated along the row direction, the length of the active region 5 being approximately equal to that of the active region 4. The active regions 5 are disposed at positions of the active regions 4 shifted by a half pitch along the row direction.

A connection member 6 extends along the column direction from an end of the active region 5 toward the n-type well 1, crosses the corresponding active region 4 and reaches the end of the active region 3. A connection member 7 extends along an up/down direction from an end of the active region 4. The portion of the connection member extending along the up direction crosses the corresponding active region 5, and the portion of the connection member extending along the down direction reaches an end of the corresponding active region 3.

Two word lines WL are disposed in correspondence with one row of the active regions 3. Each word line WL crosses the active regions 3.

One memory cell 10 is constituted of the adjacent connection members 6 and 7, a half of the active region 4, a half of the active region 5 and two halves of two active regions 3 respectively partially overlapping the connection members 6 and 7. Memory cells 10 are disposed regularly along the row and column directions.

A coupling area 11 is provided for a plurality of columns of memory cells 10, e.g., for eight columns. In this coupling area 11, an n-type well tap region 12 in ohmic contact with the n-type well 1 and a p-type well tap region 13 in ohmic contact with the p-type well 2 are disposed. The power supply voltage Vdd is applied to the n-type well tap region 12 via a wiring line 14. A ground potential Vss is applied to the p-type well tap region 13 via a wiring line 15.

In the coupling area 11, word contact holes 16 are disposed for connecting the word lines WL to upper level main word lines.

Figure 3A:
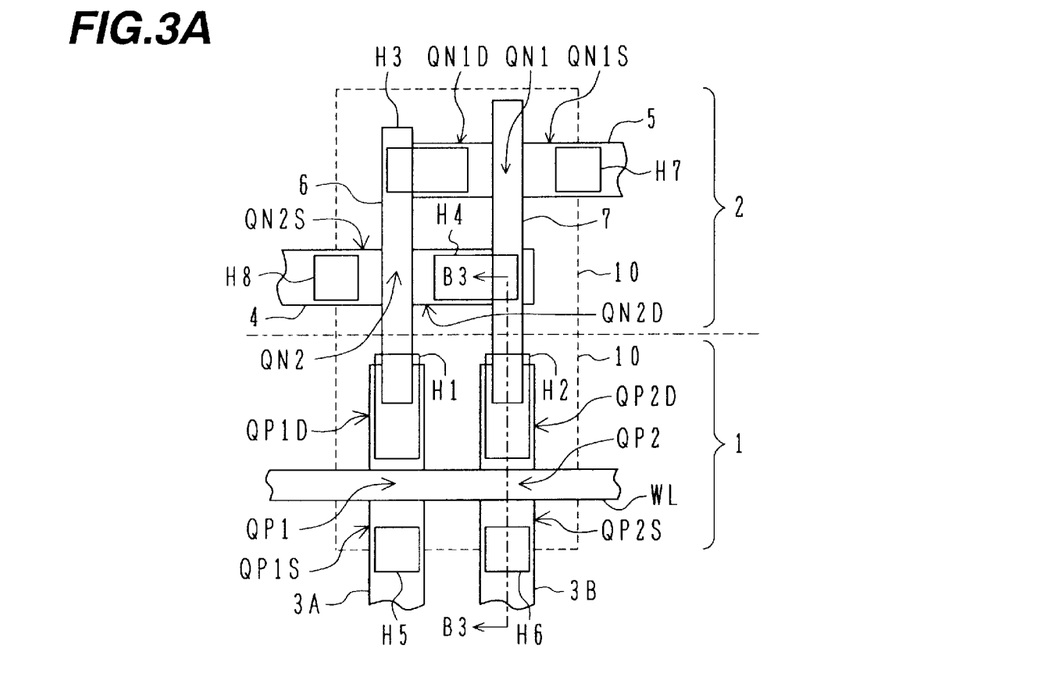
FIG. 3A is a plan view of a cell of the semiconductor device of the first embodiment.

FIG. 3A is a plan view of a memory cell 10. Active regions 3A and 3B extending along the vertical direction in FIG. 3A are disposed in the n-type well 1, and the active regions 4 and 5 extending along the lateral direction in FIG. 3A are disposed in the p-type well 2. The word line WL extending along the row direction crosses the two active regions 3A and 3B.

The PMOS transistor QP1 is disposed in the cross area between the active region 3A and word line WL, and the other PMOS transistor QP2 is disposed in the cross area between the active region 3B and word line WL. The word line WL is used also as the gate electrodes of the PMOS transistors QP1 and QP2. Regions of the active region 3A on both sides of the word line WL are a source region QP1S and a drain region QP1D. Similarly, regions of the active region 3B on both sides of the word line WL are a source region QP2S and a drain region QP2D.

The connection member 6 crosses the active region 4, and the connection member 7 crosses the active region 5. The NMOS transistor QN2 is disposed in the cross area between the connection member 6 and active region 4, and the NMOS transistor QN1 is disposed in the cross area between the connection member 7 and active region 5. Regions of the active region 4 on both sides of the connection member 6 are a source region QN2S and a drain region QN2D. Similarly, regions of the active region 5 on both sides of the connection member 7 are a source region QN1S and a drain region QN1D. Portions of the connection members 6 and 7 are also used as the gate electrodes of the NMOS transistors QN2 and QN1.

One end of the connection member 6 is superposed upon the drain region QP1D and the other end is superposed upon the drain region QN1D. The connection member 6 and drain region QP1D are interconnected by a conductive plug buried in a via hole H1. The connection member 6 and drain region QN1D are interconnected by a conductive plug buried in a via hole H3.

One end of the connection member 7 is superposed upon the drain region QP2D and the middle portion is superposed upon the drain region QN2D. The connection member 7 and drain region QP2D are interconnected by a conductive plug buried in a via hole H2. The connection member 7 and drain region QN2D are interconnected by a conductive plug buried in a via hole H4.

The source regions QN1S and QN2S are connected to an upper level ground wiring line via conductive plugs H7 and H8 buried in via holes H7 and H8. The source region QP1S is connected to an upper level bit line BL via a conductive plug buried in a via hole H5. The source region QP2S is connected to an upper inverted bit line /BL via a conductive plug buried in a via hole H6.

Figure 3B:
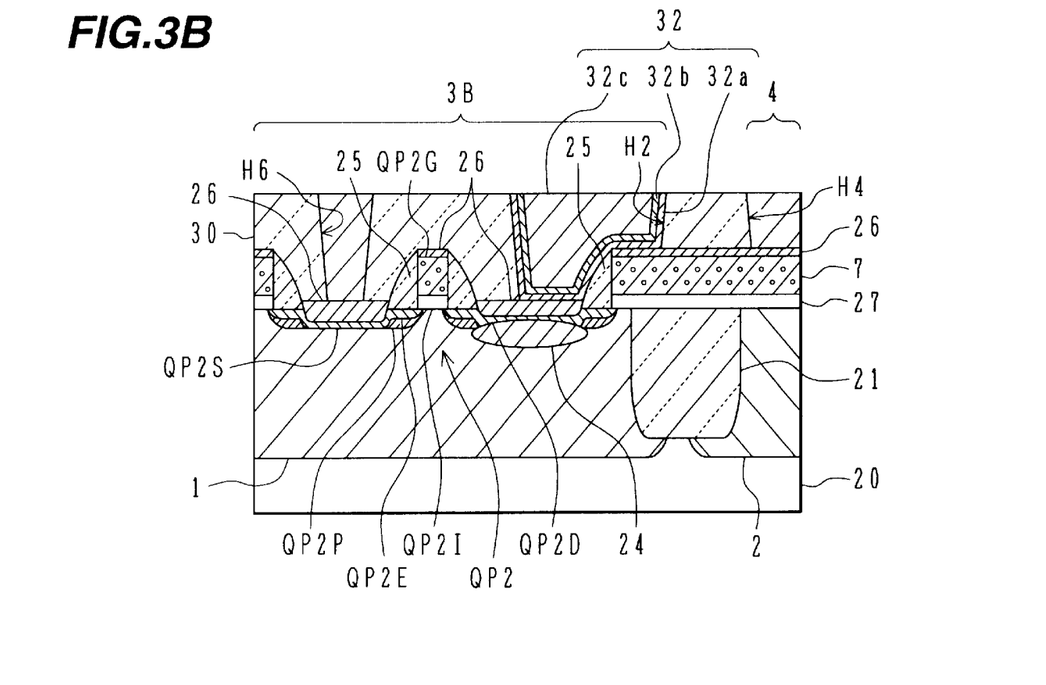
FIG. 3B is a cross sectional view of a partial portion of the cell.

FIG. 3B is a cross sectional view taken along one-dot chain line B3—B3 shown in FIG. 3A. In the surface layer of a silicon semiconductor substrate 20, an n-type well 1 and a p-type well 2 are formed. An element separation insulating film 21 is formed in the boundary area between the n-type well 1 and p-type well 2 to define the active region 3B in the n-type well 1 and the active region 4 in the p-type well 4. The n-type well 1 is formed by implanting phosphorous ions under the conditions of an acceleration energy of 600 keV and a dose of $3\times10^{13}$ cm$^{-2}$. The p-type well 2 is formed by implanting boron ions under the conditions of an acceleration energy of 300 keV and a dose of $3\times10^{13}$ cm$^{-2}$.

On the surface of the active region 3, the PMOS transistor QP2 is disposed. The PMOS transistor QP2 is constituted of a gate insulating film QP21, a gate electrode QP2G, a p-type source region QP2S and a p-type drain region QP2D. Side wall spacers 25 are formed on the side walls of the gate electrode QP2G. The gate electrode QP2G is part of the word line WL shown in FIG. 3A.

The source region QP2S and drain region QP2D have a lightly doped drain (LDD) structure. Low impurity concentration extension regions QP2E are formed by implanting boron (B) ions under the conditions of an acceleration energy of 0.5 keV and a dose of $8\times10^{14}$ cm$^{-2}$. High impurity concentration regions are formed by implanting B ions under the conditions of an acceleration energy of 3 keV and a dose of $2\times10^{15}$ cm$^{-2}$.

At a position slightly deeper than the extension regions, n-type pocket regions QP2P in contact with the extension regions are formed. The pocket region QP2P is formed by implanting arsenic (As) ions under the conditions of an acceleration energy of 60 keV and a dose of $4\times10^{14}$ cm$^{-2}$.

A lattice defect high density region 24 having a high lattice defect density is formed in the boundary area between the drain region QP2D and n-type well 1. The lattice defect high density region 24 is formed by implanting ions of atoms having a mass number larger than that of impurities in the source and drain regions, such as germanium (Ge), indium (In) and antimony (Sb) under the conditions of an acceleration energy of 100 keV and a dose of $1\times10^{14}$ cm$^{-2}$. A cobalt silicide (CoSi$_2$) film 26 is formed on the upper surfaces of the source region QP2S, drain region QP2D and gate electrode QP2G. A lattice defect high density region is not formed in the boundary area between the source region QP2S and n-type well 1.

The connection member 7 extends from a position above a partial region of the drain region QP2D to the upper surface of the active region 4 via a position above the element separation insulating film 21. The connection member 7 is formed at the same time when the gate electrode QP2G is formed. Therefore, an insulating film 27 formed at the same time when the gate insulating film QP2G is formed is disposed on the bottom of the connection member 7, a CoSi$_2$ film 26 is disposed on the upper surface of the connection member 7, and side wall spacers 25 are disposed on the side walls of the connection member 7.

An interlayer insulating film 30 of silicon oxide is formed covering the PMOS transistor QP2 and connection member 7. The via hole H2 is formed through the interlayer insulating film 30. As viewed along a direction parallel to the normal to the surface of the semiconductor substrate 20, the via hole H2 is disposed in the area superposing upon a portion of the drain region QP2D and a portion of the connection member 7.

A conductive plug 32 is buried in the via hole H2. The conductive plug 32 is constituted of a lamination of a titanium (Ti) film 32a and a titanium nitride (TiN) film 32b covering the bottom and inner surfaces of the via hole H2 and a tungsten (W) member 32c filled in the via hole H2. The conductive plug 32 contacts the CoSi$_2$ films on the upper surfaces of both the connection member 7 and drain region QP2D. Namely, the conductive plug 32 electrically interconnects the connection member 7 and drain region QP2D.

The PMOS transistor QP1 shown in FIG. 3A has the structure similar to that of the PMOS transistor QP2. The cross sectional structure of the area where the via holes H1, H3 and H4 are disposed is similar to that of the via hole H2 shown in FIG. 3B.

The power supply voltage Vdd is applied to the n-type well 1 via the n-type well tap region 12 shown in FIG. 2. Therefore, the drain region QP2D is connected to the power supply voltage Vdd via the lattice defect high density region 24 and n-type well 1. A large junction leak current flows if the lattice defect density of a pn junction is high. This junction leak current corresponds to the current flowing through the resistor element R2 shown in FIG. 1. Namely, the lattice defect high density region 24 has a function of the resistor element R2.

Since the lattice defect density of the pn junction is made high, a larger junction leak current can be flowed as compared to the case that the lattice defect density is not made high. It is therefore possible to flow a junction leak current having a desired quantity without increasing the area to be occupied by the drain region QP2D.

Next, with reference to FIGS. 4A to 4H, a method of manufacturing the semiconductor device of the first embodiment will be described. In each drawing of FIGS. 4A to 4H, the left side shows the active region 5 in which the NMOS transistor QN1 is to be disposed, and the right side shows the active region 3A in which the PMOS transistor QP1 is to be disposed. The NMOS transistor QN2 and PMOS transistor QP2 are formed by the same processes as those used for forming the NMOS transistor QN1 and PMOS transistor QP1.

Figure 4A:
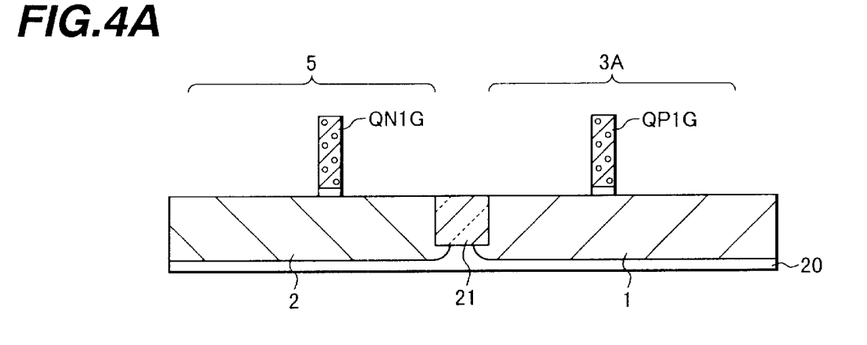
FIGS. 4A to 4H are cross sectional views illustrating a method of manufacturing the semiconductor device of the first embodiment.

As shown in FIG. 4A, in the surface layer of a silicon substrate 20, an element separation insulating film 21 of silicon oxide is formed by utilizing known shallow trench isolation (STI) technique. The element separation insulating film 21 defines the active regions 3A and 5. The p-type well 2 is formed in the region where NMOS transistors are to be formed, and the n-type well 1 is formed in the region where PMOS transistors are to be formed.

On the surface of the substrate 20, a silicon oxynitride (SiON) film of 1.2 nm in thickness is formed. The SiON film is formed by thermally oxidizing the surface of the substrate 20 and thereafter annealing the silicon oxide film in a nitrogen atmosphere. On this SiON film, a non-doped polysilicon film of 110 nm in thickness is formed by chemical vapor deposition (CVD).

The surface of the polysilicon film is covered with a resist pattern to etch the polysilicon film. A gate electrode QN1G of polysilicon is therefore left on the surface of the p-type well 2, and a gate electrode QP1G of polysilicon is left on the surface of the n-type well 1. The polysilicon film can be etched by reactive ion etching using HBr and $O_2$. The gate length is, for example, 40 to 100 nm.

After the gate electrodes QN1G and QP1G are formed, the resist pattern is removed. At this time, the SiON film not covered with the gate electrodes QN1G and QP1G is removed.

Figure 4B:
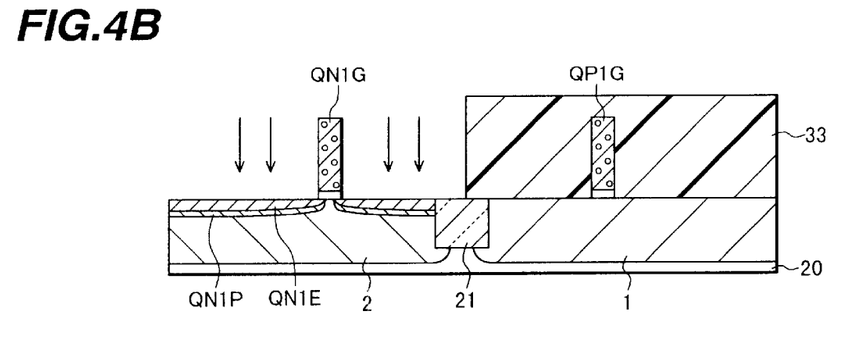

As shown in FIG. 4B, the area where the n-type well 1 is formed is covered with a resist pattern 33. By using the gate electrode QN1G as a mask, arsenic (As) ions are implanted into the surface layer of the p-type well 2 under the conditions of an acceleration energy of 5 keV and a dose of $1\times10^{15}$ cm$^{-2}$. The ion beam is inclined from the surface normal direction toward the gate length direction (carrier motion direction) and has an incidence angle of 0 to 7°. Arsenic ion implantation forms n-type extension regions QN1E of the source and drain regions.

By using the gate electrode QN1G as a mask, boron (B) ions are implanted into the surface layer of the p-type well 2 under the conditions of an acceleration energy of 9 keV and a dose of $4\times10^{14}$ cm$^{-2}$. The ion beam is inclined from the surface normal direction toward the gate length direction and has an incidence angle of 15 to 30°. Boron ion implantation forms p-type pocket regions QN1P at a position deeper than the extension regions QN1E. After the B ion implantation, the resist pattern 33 is removed.

Figure 4C:
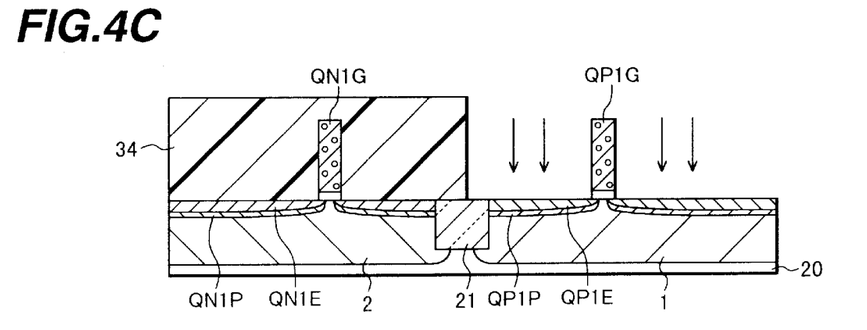

As shown in FIG. 4C, the area where the p-type well 2 is formed is covered with a resist pattern 34. By using the gate electrode QP1G as a mask, B ions are implanted into the surface layer of the n-type well 1 under the conditions of an acceleration energy of 0.5 keV and a dose of $8\times10^{14}$ cm$^{-2}$. The ion beam is inclined from the surface normal direction toward the gate length direction and has an incidence angle of 0 to 7°. B ion implantation forms p-type extension regions QP1E of the source and drain regions.

By using the gate electrode QP1G as a mask, As ions are implanted into the surface layer of the n-type well 1 under the conditions of an acceleration energy of 60 keV and a dose of $4\times10^{14}$ cm$^{-2}$. The ion beam is inclined from the surface normal direction toward the gate length direction and has an incidence angle of 15 to 30°. As ion implantation forms p-type pocket regions QP1P. After the As ion implantation, the resist pattern 34 is removed.

Figure 4D:
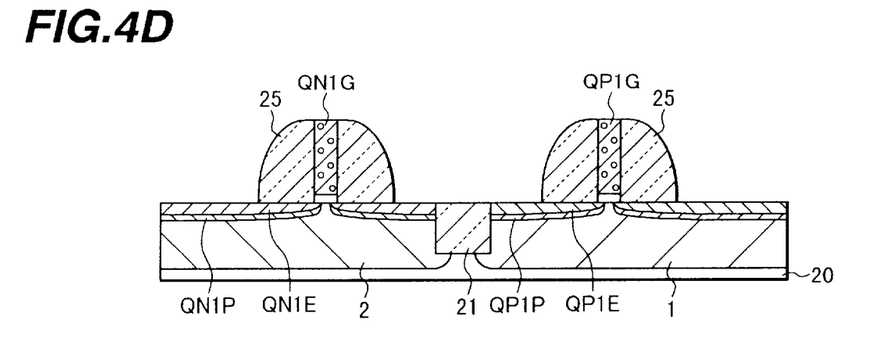

As shown in FIG. 4D, on the side walls of the gate electrodes QN1G and QP1G, side wall spacers 25 of silicon oxide are formed. The side wall spacers 25 are formed by forming a silicon oxide film having a thickness of 80 nm by CVD and thereafter anisotropically etching the silicon oxide film.

Figure 4E:
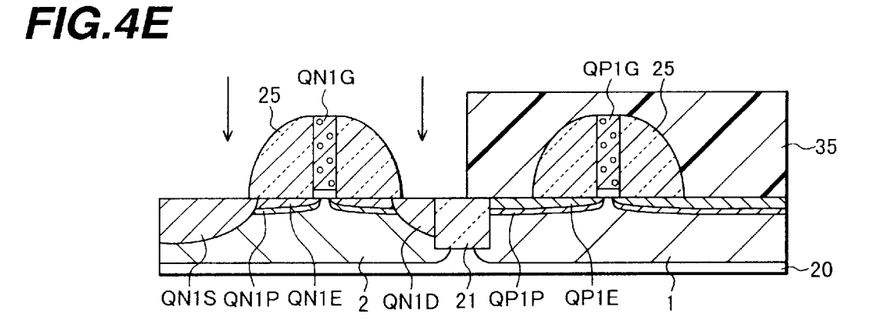

As shown in FIG. 4E, the area where the n-type well 1 is formed is covered with a resist pattern 35. By using as a mask the gate electrode QN1G and the side wall spacers 25 formed on the side walls of the gate electrode, P ions are implanted into the surface layer of the p-type well 2 under the conditions of an acceleration energy of 8 keV and a dose of $2\times10^{15}$ cm$^{-2}$. This P ion implantation forms high impurity concentration regions of the source region QN1S and drain region QN1D. At this time, P ions are also implanted into the gate electrode GN1G. After the P ion implantation, the resist pattern 35 is removed.

Figure 4F:
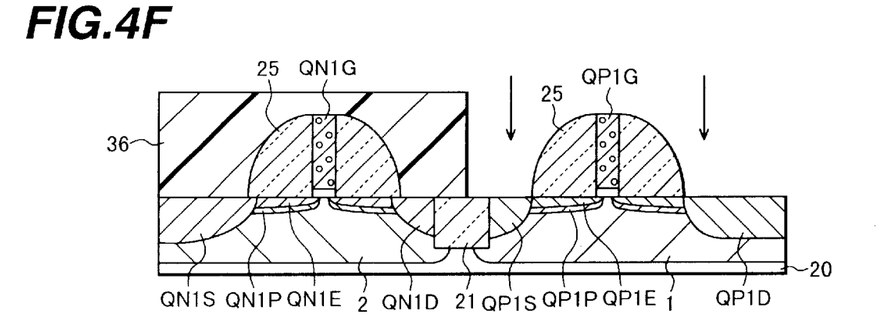

As shown in FIG. 4F, the area where the p-type well 2 is formed is covered with a resist pattern 36. By using as a mask the gate electrode QP1G and the side wall spacers 25 formed on the side walls of the gate electrode, B ions are implanted into the surface layer of the n-type well 1 under the conditions of an acceleration energy of 3 keV and a dose of $2\times10^{15}$ cm$^{-2}$. This B ion implantation forms high impurity concentration regions of the source region QP1S and drain region QP1D. At this time, B ions are also implanted into the gate electrode GP1G. After the B ion implantation, the resist pattern 36 is removed.

Figure 4G:
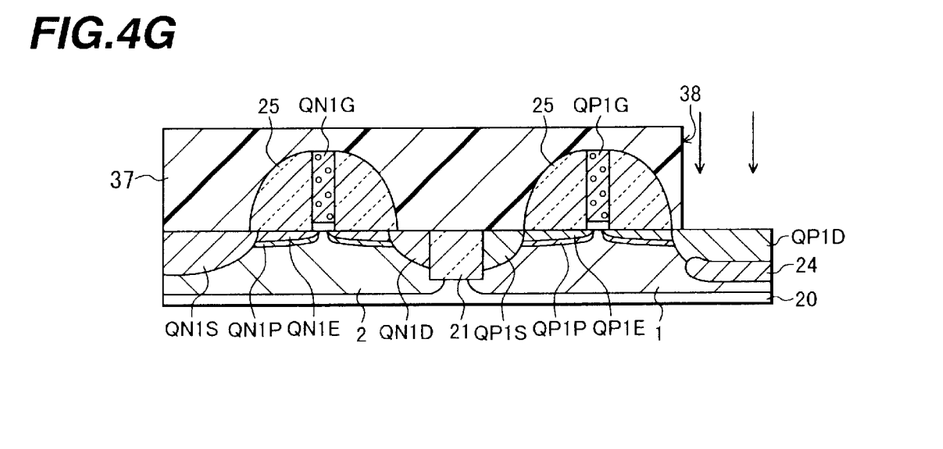

As shown in FIG. 4G, a resist pattern 37 is formed which has an opening 38 in an area corresponding to the drain region QP1D of the PMOS transistor QP1.

By using the resist pattern 37 as a mask, ions of atoms having a mass number larger than B, such as Ge, In and Sb ions, are implanted under the conditions of an acceleration energy of 100 keV and a dose of $1\times10^{14}$ cm$^{-2}$. This ion implantation forms a lattice defect high density region 24 having a high lattice defect density in the boundary area between the high impurity concentration region of the drain region QP1D and the n-type well 1. After the lattice defect high density region 24 is formed, the resist pattern 37 is removed. A heat treatment is performed for 3 seconds at 1050° C. to activate implanted impurity ions.

Figure 4H:
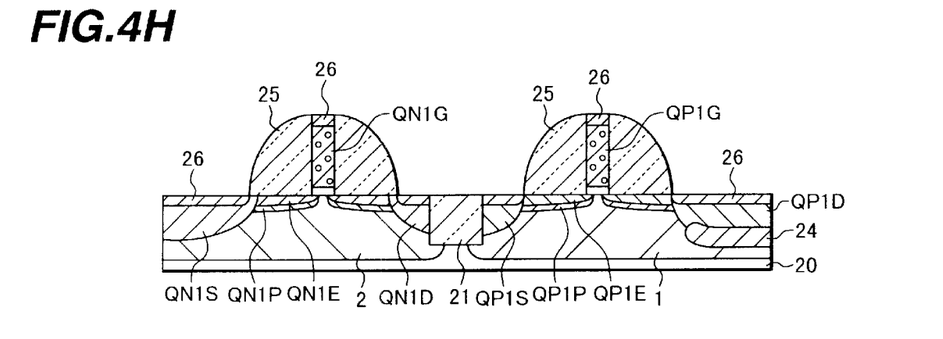

As shown in FIG. 4H, A CoSi$_2$ film 26 is formed on the exposed upper surfaces of the source regions QN1S and QP1S, drain regions QN1D and QP1D and gate electrodes QN1G and QP1G.

A method of forming the CoSi$_2$ film 26 will be described. A cobalt (Co) film is formed on the surfaces of the gate electrodes QN1G and QP1G, side wall spacers 25 and substrate 20. A heat treatment is performed to proceed a silicidizing reaction between the Co film and silicon. This silicidizing reaction forms the CoSi$_2$ film 26. After the silicidizing reaction, an unreacted Co film is removed.

The interlayer insulating film 30 and conductive plug 32 shown in FIG. 3B can be formed by known CVD, photolithography and CMP.

In this embodiment, the acceleration energy of 100 keV is used when ions are implanted to form the lattice defect high density region 24. A different acceleration energy may also be used. It is, however, preferable to adopt the conditions allowing a lattice defect density in the pn junction between the high impurity concentration region of the drain region QP1D and the n-type well 1 to be efficiently increased. For example, atoms having a large mass number are implanted to form the lattice defect high density region 24 under the conditions that the density of atoms in the depth direction becomes maximum near at the bottom of the high impurity concentration region of the drain region QP1D. Also, atoms having a large mass number are implanted under the conditions that the position where the density distribution of the atoms in the depth direction takes a maximum value becomes deeper than the position where the density distribution of B atoms in the drain region QP1D in the depth direction takes a maximum value.

Figure 5:
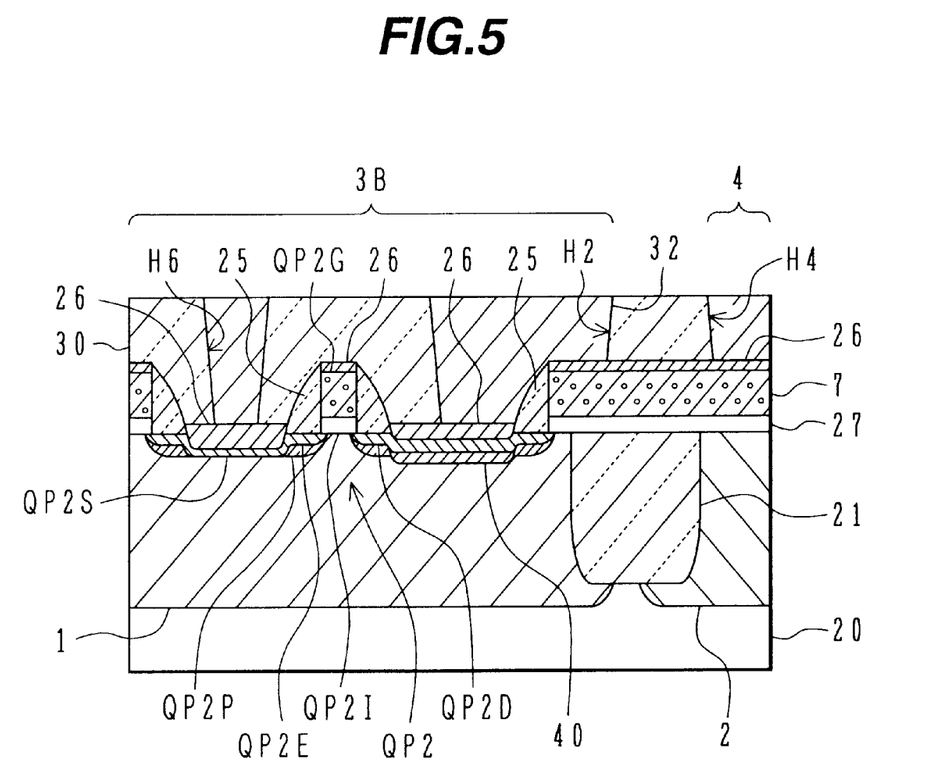
FIG. 5 is a cross sectional view of a semiconductor device according to a second embodiment.

FIG. 5 is a cross sectional view of a semiconductor device according to a second embodiment. A plan view of the semiconductor device of the second embodiment and plan views of semiconductor devices of third to sixth embodiments to be described later are similar to the plan views of the semiconductor device of the first embodiment shown in FIGS. 2 and 3A. The second to sixth embodiments will be described by paying attention to different points of the structure from those of the first embodiment.

In the second embodiment, an n-type high impurity concentration region 40 is formed in the region of the lattice defect high density region 24 shown in FIG. 3B. Instead of atoms having a large mass number used for forming the lattice defect high density region 24 of the first embodiment, n-type impurities are implanted to form the n-type high impurity concentration region 40. For example, the n-type high impurity concentration region 40 is formed by implanting arsenic ions under the conditions of an acceleration energy of 160 keV and a dose of $2 \times 10^{15}$ cm$^{-2}$.

At an interface between the high impurity concentration region of the drain region QP2D and the n-type high impurity concentration region 40, a sharp pn junction is formed. A larger leak current flows therefore as compared to the case that the drain region QP2D directly contacts the n-type well 1.

Figure 6:
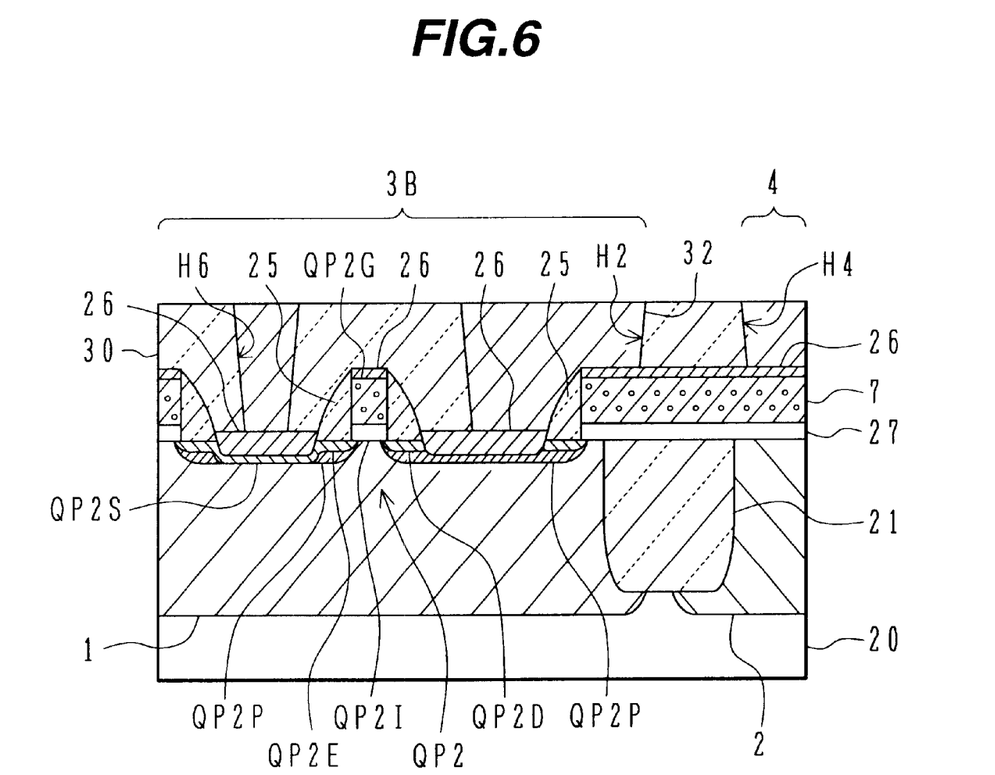
FIG. 6 is a cross sectional view of a semiconductor device according to a third embodiment.

FIG. 6 is a cross sectional view of a semiconductor device according to a third embodiment. In the third embodiment, the drain region QP2D shown in FIG. 3B is made of only the extension region, and the drain region QP2D has neither high impurity concentration region nor the lattice defect high density region 24 shown in FIG. 3B. This structure can be formed by masking the drain region QP1D with the resist pattern in the ion implantation process shown in FIG. 4F.

The CoSi$_2$ film 26 formed on the drain region QP2D penetrates through the drain region QP2D in the depth direction and reaches the pocket region QP2P. Since the impurity concentration of the pocket region QP2P is lower than that of the source and drain regions, a Schottky junction is formed at the interface between the CoSi$_2$ film 26 and pocket region QP2P. The CoSi$_2$ film 26 may penetrate through the pocket region QP2P and contacts the n-type well 1. In this case, a Schottky junction is formed at the interface between the CoSi$_2$ film 26 and n-type well 1.

In operation of the semiconductor device, this Schottky junction is reversely biased so that a reverse bias current flows. The Schottky junction functions as the resistor element shown in FIG. 1.

Figure 7:
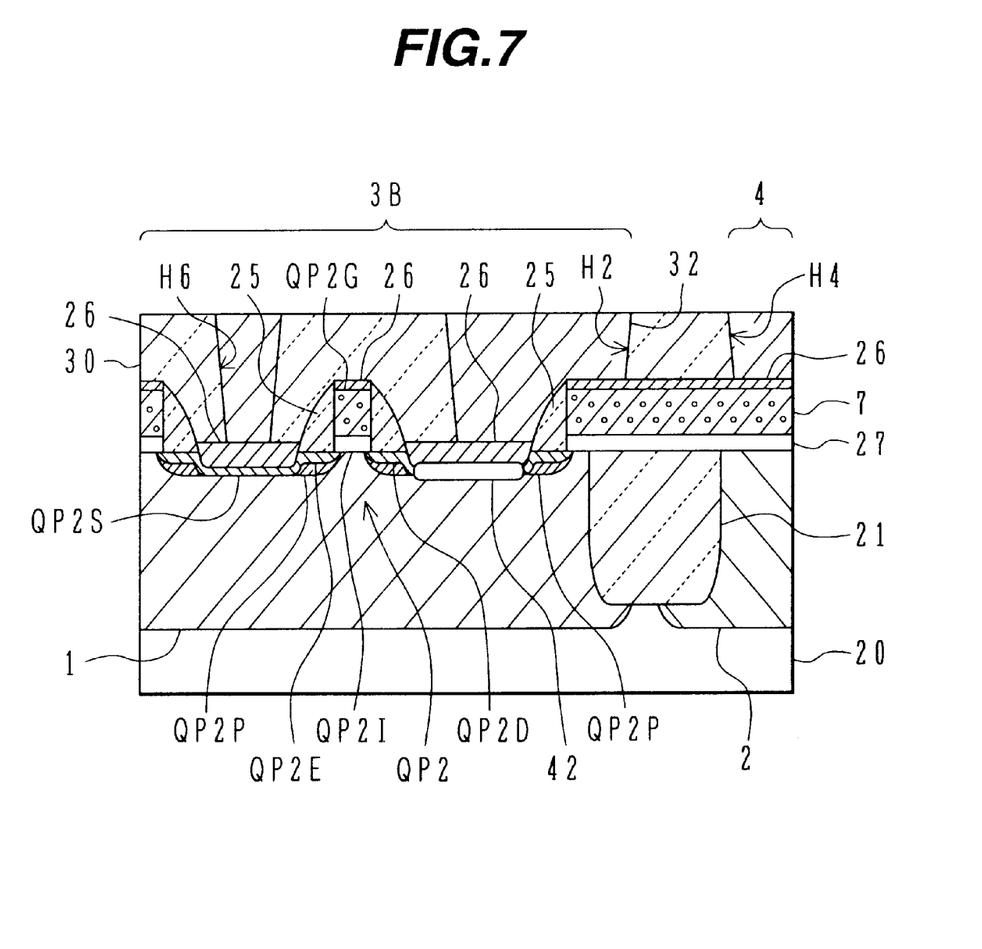
FIG. 7 is a cross sectional view of a semiconductor device according to a fourth embodiment.

FIG. 7 is a cross sectional view showing a semiconductor device according to a fourth embodiment. In the fourth embodiment, a compensation region 42 is formed in the high impurity concentration region of the drain region QP2D by implanting n-type impurity ions of the conductivity type opposite to the drain region QP2D. Since n-type impurity implantation compensates for the high p-type impurity concentration of the drain region QP2D, a substantial impurity concentration lowers. A Schottky junction is therefore formed at the interface between the CoSi$_2$ film 26 and compensation region 42. Similar to the third embodiment, this Schottky junction functions as the resistor element R2 shown in FIG. 1.

The compensation region 42 is formed by performing the ion implantation for forming the source and drain regions shown in FIG. 4F, thereafter forming a resist pattern having openings corresponding to the drain regions QP1D and QP2D, and implanting n-type impurities.

The n-type impurity implantation conditions are set so that a Schottky junction is formed between the CoSi$_2$ film 26 and compensation region 42. It is expected that a Schottky junction can be formed if the substantial impurity concentration of the region in contact with the CoSi$_2$ film 26 is $1 \times 10^{19}$ cm$^{-3}$ or smaller. For example, an acceleration energy is set so that a concentration distribution in the depth direction is approximately equal to that of p-type impurities in the drain regions QP1D and QP2D. A dose of n-type impurity is set approximately equal to that of p-type impurity.

Figure 8:
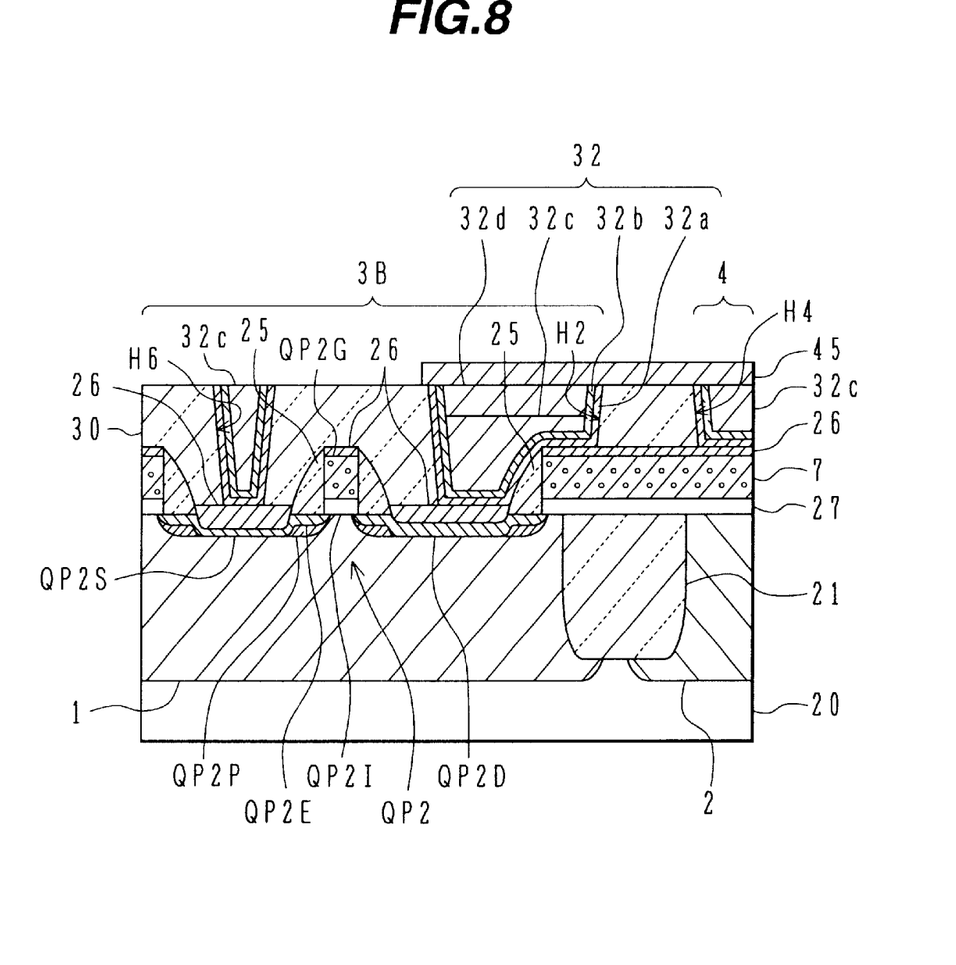
FIG. 8 is a cross sectional view of a semiconductor device according to a fifth embodiment.

FIG. 8 is a cross sectional view of a semiconductor device according to a fifth embodiment. In the fifth embodiment, the lattice defect high density region 24 shown in FIG. 3B is not formed. Instead, a conductive plug 32 buried in a via hole H2 functions as the resistor element.

The bottom and inner surfaces of the via hole H2 are covered with a Ti film 32$a$, and a TiN film 32$b$ is formed on the Ti film 32$a$. A low resistance member 32$c$ is buried in a partial space of the via hole H2 on the substrate side, and the remaining upper space is buried with a high resistance member 32$d$ having a resistivity higher than that of the low resistance member 32$c$. The connection member 7 and drain region QP2D are electrically connected by the low resistance member 32$c$. Although the end of the connection member 7 is drawn superposed upon the active region 3B in FIG. 8, they are not necessarily required to be superposed upon each other. If the connection member 7 reaches the position above the element separation insulating film 21 adjacent to the active region 3B, the drain region QP2D and connection member 7 can be electrically connected via the low resistance member 32$c$.

The via holes H4 and H6 are buried not with the high resistance member but only with the Ti layer 32$a$, TiN layer 32$b$ and low resistance member 32$c$.

A power supply wiring line 45 for supplying the power supply voltage Vdd is formed on the interlayer insulating film 30. The power supply wiring line 45 is connected to the high resistance member 32d. The drain region QP2D is connected to the power supply wiring line 45 via the low resistance member 32c and high resistance member 32d. Therefore, the high resistance member 32d functions as the resistor element R2 shown in FIG. 1. Since a partial region of the conductive plug buried in the via hole H2 is the high resistance member, a space for the resistance member is not necessary. A cell area can therefore be reduced.

For example, the low resistance member 32c is made of tungsten. The high resistance member 32d can be formed by nitridizing or oxidizing the tungsten buried in the via hole H2. Namely, the high resistance member 32d is made of tungsten nitride or tungsten oxide. Nitridizing or oxidizing tungsten is performed by covering the surface of the interlayer insulating film 30 with a resist pattern having an opening corresponding to the via hole H2 and by implanting nitrogen ions or oxygen ions into the tungsten or by exposing the tungsten surface to nitrogen plasma or oxygen plasma.

The high resistance member 32d may be made of material having a resistivity higher than that of the $CoSi_2$ film 26, e.g., polysilicon. In this case, the upper layer of tungsten buried in the via hole H2 is etched back and then polysilicon is buried in the etched-back space to form the high resistance member 32d.

The high resistance member 32d may be made of a thin silicon oxide film or a thin silicon nitride film. In order to obtain current necessary for data retention of an SRAM cell, the silicon oxide film or silicon nitride film is required to be thin. It is preferable to thin the silicon oxide film or silicon nitride film to such an extent that current flowing through the thin silicon oxide film or thin silicon nitride film constituting the high resistance member 32d when the NMOS transistor QN2 shown in FIG. 1 is not conductive becomes larger than the gate leak current of the NMOS transistor QN2.

Figure 9:
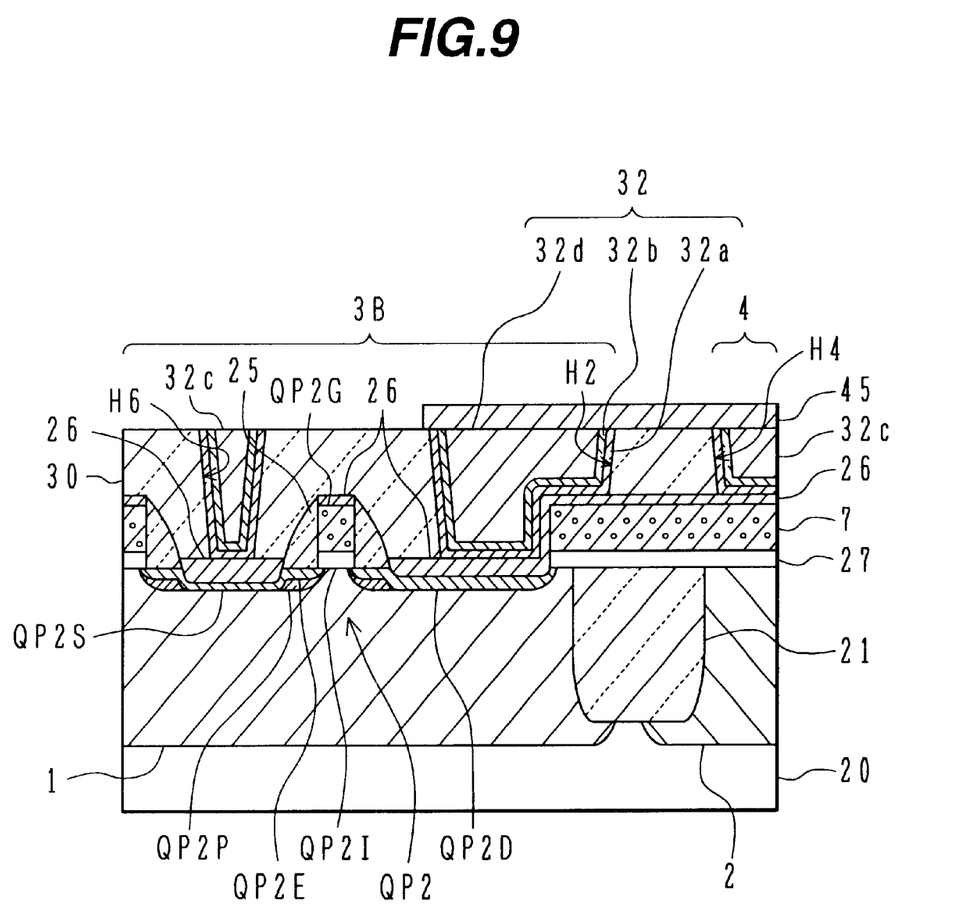
FIG. 9 is a cross sectional view of a semiconductor device according to a sixth embodiment.

FIG. 9 is a cross sectional view of a semiconductor device according to a sixth embodiment. In the sixth embodiment, the side wall spacers on the side walls of the connection member 7 are omitted. Therefore, the $CoSi_2$ film 26 is formed on the side walls of the connection member 7. The drain region QP2D and connection member 7 are electrically connected via the $CoSi_2$ film 26. The bottom and inner surfaces of the via hole H2 are covered with the Ti film 32a and TiN film 32b, and the high resistance member 32d is buried in the via hole H2. The other structure is similar to that of the semiconductor device of the fifth embodiment shown in FIG. 8.

In the sixth embodiment, the high resistance member 32d buried in the via hole H2 functions as the resistor element R2 shown in FIG. 1.

In the sixth embodiment, since the $CoSi_2$ film 26 interconnects the drain region QP2D and connection member 7, the low resistance member 32c in the via hole H2 of the fifth embodiment shown in FIG. 8 is not necessary. Similar to the fifth embodiment, the low resistance member 32c may be disposed in the partial space of the via hole H2 on the substrate side.

The present invention has been described in connection with the preferred embodiments. The invention is not limited only to the above embodiments. It is apparent that various modifications, improvements, combinations, and the like can be made by those skilled in the art.

What we claim are:

1. A semiconductor device comprising:
   a first well of a first conductivity type formed in a partial region of a surface layer of a semiconductor substrate;
   a MOS transistor having a gate insulating film formed on a partial area of a surface of the first well, a gate electrode disposed on the gate insulating film and first and second impurity diffusion regions of a second conductivity type opposite to the first conductivity type formed in a surface layer of the first well on both sides of the gate electrode; and
   a high leak current structure which makes a leak current density when a reverse bias voltage is applied across the first impurity diffusion region of the MOS transistor and the first well become higher than a leak current density when the same reverse bias voltage is applied across the second impurity diffusion region and the first well.

2. A semiconductor device according to claim 1, wherein the high leak current structure comprises a lattice defect high density region disposed at an interface between the first impurity diffusion region and the first well, the lattice defect high density region having a lattice defect density higher than a lattice defect density at an interface between the second impurity diffusion region and the first well.

3. A semiconductor device according to claim 1, wherein the high leak current structure comprises a high impurity concentration region disposed at an interface between the first impurity diffusion region and the first well, the high impurity concentration region being doped with impurities of the first conductivity type and having an impurity concentration higher than an impurity concentration of the first well.

4. A semiconductor device according to claim 1, wherein:
   the second impurity diffusion region comprises a first region disposed apart from an edge of the gate electrode and an extension region being shallower than the first region and being disposed between the first region and the edge of the gate electrode;
   the first impurity diffusion region is shallower than the first region; and
   the high leak current structure comprises a metal suicide region formed in the first impurity diffusion region, the metal silicide region penetrating through the first impurity diffusion region in a depth direction and reaching a region of the first conductivity type of the first well.

5. A semiconductor device according to claim 1, wherein:
   a third impurity diffusion region doped with impurities of the first conductivity type is formed in a partial region of the first impurity diffusion region; and
   the high leak current structure comprises a metal silicide film formed in a surface layer of the third impurity diffusion region wherein an interface between the metal silicide film and the third impurity diffusion region is a Schottky junction.

6. A semiconductor device comprising:
   a first well of a first conductivity type formed in a partial region of a surface layer of a semiconductor substrate;
   a second well of a second conductivity type opposite to the first conductivity type formed in a partial region of the surface layer of the semiconductor substrate;
   first and second transistors disposed in the first well, each of the first and second transistors comprising a gate insulating film, a gate electrode and source and drain regions of the second conductivity type formed in the surface layer of the first well on both sides of the gate electrode;
   third and fourth transistors disposed in the second well, each of the third and fourth transistors comprising a gate insulating film, a gate electrode and source and drain regions of the first conductivity type formed in the surface layer of the second well on both sides of the gate electrode;

a word line interconnecting the gate electrode of the first transistor and the gate electrode of the second transistor;

a first connection member interconnecting the gate electrode of the third transistor, the drain region of the first transistor and the drain region of the fourth transistor;

a second connection member interconnecting the gate electrode of the fourth transistor, the drain region of the second transistor and the drain region of the third transistor; and a high leak current structure which makes a leak current density when a reverse bias voltage is applied across each of the drain regions of the first and second transistors and the first well become higher than a leak current density when the same reverse bias voltage is applied across each of the source regions of the first and second transistors and the first well.

7. A semiconductor device according to claim 6, further comprising:

a first power supply wiring connected to the first connection member; and a second power supply wiring connected to the first well, wherein a polarity of a power supply voltage applied to the first and second power supply wirings corresponds to a reverse bias voltage applied between each of the drain regions of the first and second transistors and the first well.

8. A semiconductor device comprising:

an element separation insulating film formed in a partial region of a surface layer of a semiconductor substrate and defining an outer periphery of each of first and second active regions;

an impurity diffusion region formed in a surface layer of the first active region;

a first connection member consisting of conductive material and extending from a position above the second active region to a position above the element separation insulating film adjacent to the first active region;

an interlayer insulating film covering the impurity diffusion region and the first connection member;

a via hole formed through the interlayer insulating film, the via hole overlapping a partial area of the impurity diffusion region and a partial area of the first connection member as viewed along a direction in parallel to a normal to a surface of the semiconductor substrate;

a second connection member buried in a space in the via hole adjacent to the semiconductor substrate, the second connection member electrically connecting the impurity diffusion region and the first connection member;

a third connection member buried in a space in the via hole on the opposite side to the semiconductor substrate, the third connection member having a resistivity higher than a resistivity of the second connection member; and a wiring formed on the interlayer insulating film and connected to the third connection member.

9. A semiconductor device according to claim 8, wherein the second connection member consists of metal material and the third connection member consists of oxide or nitride of the metal material that the second connection member consists of.

10. A semiconductor device comprising:

a first well of a first conductivity type formed in a partial region of a surface layer of a semiconductor substrate;

a second well of a second conductivity type opposite to the first conductivity type formed in a partial region of the surface layer of the semiconductor substrate;

an element separation insulating film formed in a partial region of the surface layer of the semiconductor substrate and defining first and second active regions in the first well and third and fourth active regions in the second well;

a first transistor formed in the first active region and comprising a gate insulating film, a gate electrode and source and drain regions formed in a surface layer of the first well on both sides of the gate electrode;

a second transistor formed in the second active region and comprising a gate insulating film, a gate electrode and source and drain regions formed in the surface layer of the first well on both sides of the gate electrode;

a third transistor formed in the third active region and comprising a gate insulating film, a gate electrode and source and drain regions formed in a surface layer of the second well on both sides of the gate electrode;

a fourth transistor formed in the fourth active region and comprising a gate insulating film, a gate electrode and source and drain regions formed in the surface layer of the second well on both sides of the gate electrode;

a word line interconnecting the gate electrode of the first transistor and the gate electrode of the second transistor;

a first connection member interconnecting the gate electrode of the third transistor and the drain region of the fourth transistor and reaching a position above the element separation insulating film adjacent to the drain region of the first transistor;

a second connection member interconnecting the gate electrode of the fourth transistor and the drain region of the third transistor and reaching a position above the element separation insulating film adjacent to the drain region of the second transistor;

an interlayer insulating film formed above the semiconductor substrate covering the first to fourth transistors;

a first via hole formed through the interlayer insulating film, the first via hole overlapping at least a partial area of the drain region of the first transistor and a partial area of the first connection member as viewed along a direction in parallel to a normal to a surface of the semiconductor substrate;

a second via hole formed through the interlayer insulating film, the second via hole overlapping at least a partial area of the drain region of the second transistor and a partial area of the second connection member as viewed along the direction in parallel to the normal to the surface of the semiconductor substrate;

a third connection member buried in a space in the first via hole adjacent to the semiconductor substrate and electrically connecting the drain region of the first transistor and the first connection member;

a fourth connection member buried in a space in the first via hole on the opposite side to the semiconductor substrate and connected to the third connection member, the fourth connection member having a resistivity higher than a resistivity of the third connection member;

a fifth connection member buried in a space in the second via hole adjacent to the semiconductor substrate and electrically connecting the drain region of the second transistor and the second connection member;

a sixth connection member buried in a space in the second via hole on the opposite side to the semiconductor substrate and connected to the fifth connection member, the sixth connection member having a resistivity higher than a resistivity of the fifth connection member; and a wiring formed on the interlayer insulating film and connected to the fourth and sixth connection members.

11. A semiconductor device according to claim 10, wherein:

the fourth connection member comprises a thin insulating film consisting of silicon oxide, silicon nitride or silicon oxynitride; and a thickness of the thin insulating film is set so that a current flowing from the wiring to the first connection member via the fourth connection member when the first transistor is off state is larger than a sum of a gate leak current and a drain junction leak current of the first transistor.

12. A semiconductor device comprising:

an element separation insulating film formed in a partial region of a surface layer of a semiconductor substrate and defining an outer periphery of each of first and second active regions;

an impurity diffusion region formed in a surface layer of the first active region;

a first connection member consisting of conductive material, the first connection member extending from a position above the second active region to a position above the first active region via a region on the element separation insulating film;

a conductive film electrically interconnecting the first connection member and the impurity diffusion region, the conductive film extending from an upper surface of the first connection member to an upper surface of the impurity diffusion region via a side wall of the first connection member;

an interlayer insulating film covering the impurity diffusion region and the first connection member;

a via hole formed through the interlayer insulating film, the via hole overlapping a partial area of the conductive film as viewed along a direction in parallel to a normal to a surface of the semiconductor substrate;

a second connection member buried in the via hole and consisting of material having a resistivity higher than a resistivity of the conductive film; and a wiring formed on the interlayer insulating film and connected to the second connection member.

13. A semiconductor device according to claim 12, wherein the semiconductor substrate and the first connection member contain silicon as a main composition and the conductive film consists of metal silicide.

14. A semiconductor device comprising:

a first well of a first conductivity type formed in a partial region of a surface layer of a semiconductor substrate;

a second well of a second conductivity type opposite to the first conductivity type formed in a partial region of the surface layer of the semiconductor substrate;

an element separation insulating film formed in a partial region of the surface layer of the semiconductor substrate and defining first and second active regions in the first well and third and fourth active regions in the second well;

a first transistor formed in the first active region and comprising a gate insulating film, a gate electrode and source and drain regions formed in a surface layer of the first well on both sides of the gate electrode;

a second transistor formed in the second active region and comprising a gate insulating film, a gate electrode and source and drain regions formed in the surface layer of the first well on both sides of the gate electrode;

a third transistor formed in the third active region and comprising a gate insulating film, a gate electrode and source and drain regions formed in a surface layer of the second well on both sides of the gate electrode;

a fourth transistor formed in the fourth active region and comprising a gate insulating film, a gate electrode and source and drain regions formed in the surface layer of the second well on both sides of the gate electrode;

a word line interconnecting the gate electrode of the first transistor and the gate electrode of the second transistor;

a first connection member interconnecting the gate electrode of the third transistor and the drain region of the fourth transistor and reaching a position above the drain region of the first transistor;

a first conductive film electrically connecting the first connection member and the drain region of the first transistor, the first conductive film extending from an upper surface of the first connection member to an upper surface of the drain region of the first transistor via a side well of the first connection member;

a second connection member interconnecting the gate electrode of the fourth transistor and the drain region of the third transistor and reaching a position above the drain region of the second transistor;

a second conductive film electrically connecting the second connection member and the drain region of the second transistor, the second conductive film extending from an upper surface of the second connection member to an upper surface of the drain region of the second transistor via a side well of the second connection member;

an interlayer insulating film formed above the semiconductor substrate covering the first to fourth transistors;

a first via hole formed through the interlayer insulating film, the first via hole overlapping at least a partial area of the first conductive film as viewed along a direction in parallel to a normal to a surface of the semiconductor substrate;

a second via hole formed through the interlayer insulating film, the second via hole overlapping at least a partial area of the second conductive film as viewed along the direction in parallel to the normal to the surface of the semiconductor substrate;

a third connection member buried in the first via hole and electrically connected to the first conductive film, the third connection member consisting of material having a resistivity higher than a resistivity of the first conductive film;

a fourth connection member buried in the second via hole and electrically connected to the second conductive film, the fourth connection member consisting of material having a resistivity higher than a resistivity of the second conductive film; and a wiring formed on the interlayer insulating film and connected to the third and fourth connection members.

* * * * *